United States Patent [19]
Fazan et al.

[11] Patent Number: 5,966,615
[45] Date of Patent: Oct. 12, 1999

[54] METHOD OF TRENCH ISOLATION USING SPACERS TO FORM ISOLATION TRENCHES WITH PROTECTED CORNERS

[75] Inventors: Pierre C. Fazan; Martin C. Roberts; Gurtej S. Sandhu, all of Boise, Id.

[73] Assignee: Micron Technology, Inc., Boise, Id.

[21] Appl. No.: 09/025,078

[22] Filed: Feb. 17, 1998

Related U.S. Application Data

[62] Division of application No. 08/798,968, Feb. 11, 1997, Pat. No. 5,868,870, which is a continuation of application No. 08/355,145, Dec. 13, 1994, Pat. No. 5,733,383, which is a continuation of application No. 07/988,613, Dec. 10, 1992, Pat. No. 5,433,794.

[51] Int. Cl.⁶ ................................................. H01L 21/762
[52] U.S. Cl. ............................................. 438/424; 438/978
[58] Field of Search ........................ 438/424, FOR 227, 438/437, 978, FOR 458, FOR 492; 148/DIG. 50, DIG. 85, DIG. 86

[56] References Cited

U.S. PATENT DOCUMENTS

| | | |
|---|---|---|
| 4,104,086 | 8/1978 | Bondur et al. . |
| 4,506,435 | 3/1985 | Pliskin et al. . |
| 4,549,927 | 10/1985 | Goth et al. . |
| 4,571,819 | 2/1986 | Rogers et al. . |
| 4,582,565 | 4/1986 | Kawakatsu . |
| 4,661,832 | 4/1987 | Lechaton et al. . |
| 4,729,006 | 3/1988 | Dally et al. . |
| 4,740,480 | 4/1988 | Ooka . |
| 4,853,344 | 8/1989 | Darmawan . |
| 4,952,524 | 8/1990 | Lee et al. . |
| 4,985,368 | 1/1991 | Ishii et al. . |
| 5,059,550 | 10/1991 | Tateoka et al. . |
| 5,168,076 | 12/1992 | Godchino et al. . |
| 5,213,994 | 5/1993 | Fuchs . |
| 5,229,315 | 7/1993 | Jun et al. . |
| 5,229,317 | 7/1993 | Nishio . |
| 5,281,550 | 1/1994 | Ducreux . |
| 5,306,940 | 4/1994 | Yamazaki . |
| 5,447,884 | 9/1995 | Fahey et al. . |
| 5,468,676 | 11/1995 | Madan . |
| 5,506,168 | 4/1996 | Morita et al. . |
| 5,576,241 | 11/1996 | Sakai . |
| 5,677,229 | 10/1997 | Morita et al. . |
| 5,801,082 | 9/1998 | Tseng . |
| 5,801,083 | 9/1998 | Yu et al. . |

FOREIGN PATENT DOCUMENTS

| | | |
|---|---|---|
| 56-104444 | 8/1981 | Japan . |
| 58-30136 | 2/1983 | Japan . |
| 58-151034 | 9/1983 | Japan . |
| 61-80833 | 4/1986 | Japan . |
| 61-214446 | 9/1986 | Japan . |
| 11343 | 1/1989 | Japan . |
| 155853 | 3/1989 | Japan . |
| 3-10147 | 4/1991 | Japan . |
| 8504516 | 10/1985 | WIPO . |

OTHER PUBLICATIONS

"The Inverse–Narrow–Width Effect", Lex A. Akers, IEEE Electron Device Letters, vol. EDL-7, No. 7, Jul. 1986, pp. 419–421.

"Trench Isolation with Boron Implanted Side-Walls for Controlling Narrow Width Effect of N–Mos Threshold Voltages", Fuse et al., Semiconductor Research Center, Matsushita Eelectric Industrial Co., V1-2, pp. 58–59 (Date unknown).

"A Practical Trench Isolation Technology with a Novel Planarization Process", Fuse et al., Semiconductor Research Center, Matsushita Electric Industrial Co., Ltd 3–15, 1987 IEEE, pp. 732–735.

(List continued on next page.)

*Primary Examiner*—George R. Fourson
*Attorney, Agent, or Firm*—Walter D. Fields

[57] ABSTRACT

A trench for isolating active devices on a semiconductor substrate, formed by creating a trench which has a peripheral edge, and disposing an isolating material in the trench. The isolating material extends over the peripheral edge of the trench, thereby covering at least a portion of the substrate surrounding the trench, and substantially limiting leakage of the active devices disposed on the substrate.

12 Claims, 2 Drawing Sheets

OTHER PUBLICATIONS

"A Simplified Box (Buried–Oxide) Isolation Technology for Megabit Dynamic Memories", Shibata et al., Toshiba Research and Development Center, 1983 IEEE pp. 27–30.

"A Variable–Size Shallow Trency Isolation (STI) Technology with Diffused Sidewall Doping for Submicron CMOS", Davari et al., IBM T.J. Watson Res. Center, 1988 IEEE, pp. 92–95.

"A New Planarization Technique, Using a Combination of Rie and Chemical Mechanical Polish (CMP)", Davari et al. IBM Research, T.J. Watson Res. Center, 1989 IEEE, pp. 61–64.

"A New Three–Dimensional MOSFET Gate–Induced Drain Leakage Effect in Narrow Deep Submicron Devices", Geissler et al., IBM General Technology Division, 1991 IEEE, pp. 839–842.

IBM Technical Disclosure Bulletin, vol. 31, No. 7, pp. 178–179, Dec. 1988.

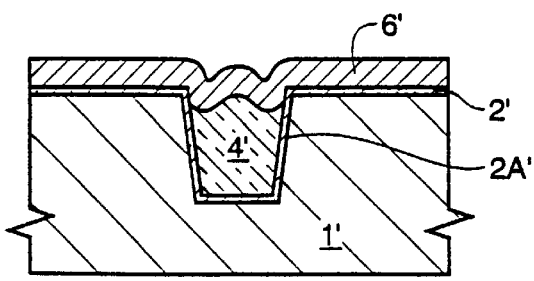
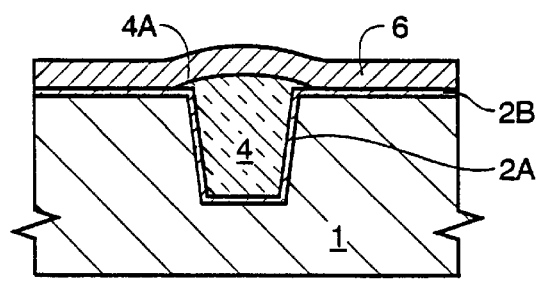
FIG. 1
(RELATED ART)
FIG. 2
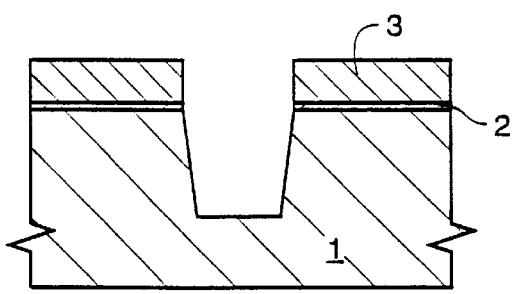
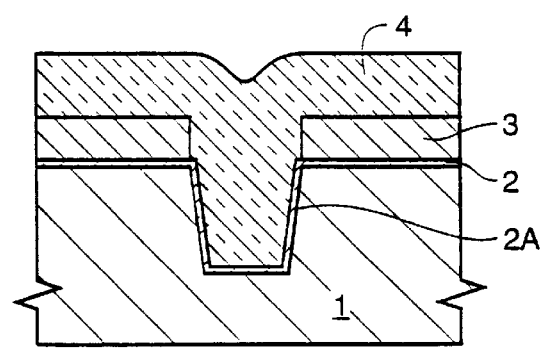
FIG. 3
FIG. 4
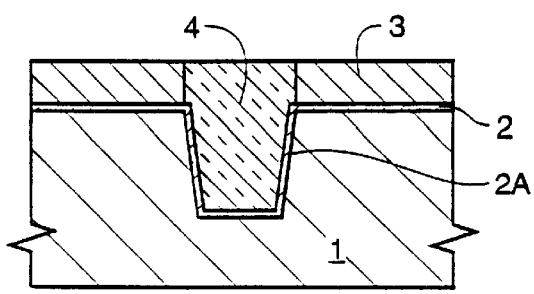
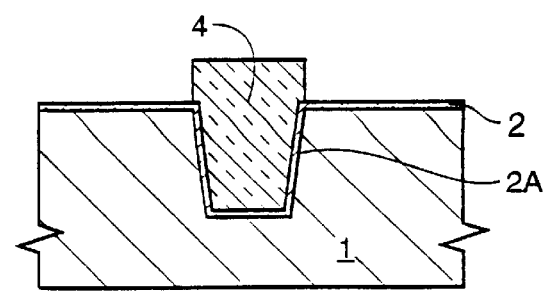
FIG. 5
FIG. 6

METHOD OF TRENCH ISOLATION USING SPACERS TO FORM ISOLATION TRENCHES WITH PROTECTED CORNERS

This application is a divisional application of application Ser. No. 08/798,968, filed Feb. 11, 1997, now U.S. Pat. No. 5,868,870, which is a continuation of application Ser. No. 08/355,145, filed Dec. 13, 1994, now U.S. Pat. No. 5,733,383, which is a continuation of application Ser. No. 07/988,613, filed Dec. 10, 1992, now U.S. Pat. No. 5,433,794 and issued Jul. 18, 1995.

FIELD OF THE INVENTION

This invention relates to semiconductor manufacturing, and more particularly to the formation of trenches useful in isolating active areas on a semiconductor substrate.

BACKGROUND OF THE INVENTION

As device dimensions get smaller, and device density increases, it becomes more and more difficult to build an efficient and reliable isolation process to separate active devices. The limits of the standard LOCOS process have motivated the search for and the development of new isolation schemes, and trench isolation is a promising candidate as it uses a fully recessed oxide, has no birds beaks, is fully planar, and does not suffer from the field oxide thinning effect.

However, the trench isolation process still suffers from problems such as "corners" effects at the trench edge that can increase device leakage current, especially when the trench is recessed. This problem has been mentioned in a scientific paper entitled, "A New Three-Dimensional MOSFET Gate-Induced Drain Leakage Effect in Narrow Deep Submicron Devices," by Geissler, Porth, Lasky, Johnson and Voldman, and published in the 1991 IEEE IEDM Technical Digest in which it is described as a key problem of isolation trench technology. The present invention substantially eliminates this problem by creating a smooth trench profile with a self-aligned cap or dome.

SUMMARY OF THE INVENTION

The process of the present invention solves the corner effects problem found with trench isolated structures and smoothes the wafers' surface by adding spacer forming steps to the process.

The process of the present invention is begun with the standard trench forming steps, but further forms spacers around the periphery of the trench. These spacers then combine with the isolation material disposed in the trench to form a dome-like structure over the trench. The cover extends over the peripheral edges of the trench thereby limiting the corners effect. The problem of the recessed regions in the trench is substantially avoided. Hence, it is possible to avoid the forming of sharp corners by creating a small rounded cap over the trench.

BRIEF DESCRIPTION OF THE DRAWINGS

The present invention will be better understood from reading the following description of nonlimitative embodiments, with reference to the attached drawings, wherein below:

FIG. 1 is a schematic cross-section of a semiconductor substrate having a filled trench, illustrating the "corners" effect at the trench edge;

FIG. 2 is a schematic cross-section of a semiconductor substrate having a filled trench, illustrating a smooth trench profile and a self-aligned cap according to the present invention;

FIG. 3 is a schematic cross-section of a trench in a semiconductor substrate on which has been grown or deposited a pad oxide layer and a mask layer according to the present invention;

FIG. 4 is a schematic cross-section of the substrate of FIG. 3, after a thermal oxide has been grown in the trench and a blanket layer of isolation material has been deposited, according to the present invention;

FIG. 5 is a schematic cross-section of the substrate of FIG. 4, in which the isolating material has been removed to expose the masking layer, but remains in the trench, according to the present invention;

FIG. 6 is a schematic cross-section of the substrate of FIG. 5, in which the masking layer is removed, according to the present invention;

DETAILED DESCRIPTION OF THE INVENTION

Figure 7:
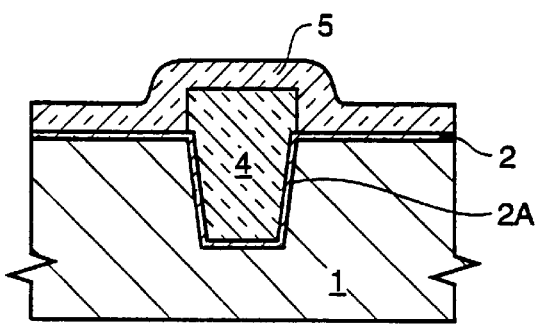
FIG. 7 is a schematic cross-section of the substrate of FIG. 6, on which has been deposited an insulating layer, according to the present invention.

FIG. 1 illustrates one of the problems currently confronting semiconductor manufacturers in the formation of isolation trenches T. When the isolation material 4' is etched, an uneven profile frequently results wherein little or no isolating material 4' remains at the corners of the trench T. The exposed corners are potential points of current leakage between regions of the active areas (not shown), thus the phrase "corners" effect.

Applicants' solution to the problem of the "corners" effect is illustrated by the isolation trench T of FIG. 2. The isolation trench T of the present invention has a smooth profile. The material 4 which is disposed in the trench T extends over the peripheral edges of the trench T, thereby covering the corners, and minimizing the problem of leakage between regions of the active areas, such as transistors and source/drain regions of transistors.

The isolation trench T of the present invention is made by the process described below. Referring to FIG. 3, a semiconductor substrate 1 is illustrated in which a trench T has been formed. The trench T is between approximately $0.2\mu$ and $0.8\mu$ in depth, the preferred depth being $0.4\mu$. Hence, the term "shallow" trench isolation.

The trench T has sidewalls which can be substantially vertical to the substrate, or slightly sloped, i.e., having an angle of approximately 90° to 70°. If the trench sidewalls are sloped too much, it becomes difficult to etch a trench T to the desired depth.

On the surface of the substrate are disposed layers 2 and 3. In the preferred embodiment, insulating layer 2 is an oxide, frequently called a pad oxide. However, any suitable insulating material known in the art could be used.

Layer 3 is preferably a nitride layer which has been deposited by any of the methods well known in the art. Although a nitride mask layer has insulative properties, a conductive layer can also be used to form the mask layer 3. For example, a polysilicon mask or a polysilicon/nitride mask could also be used to form layer 3. The active areas of the semiconductor wafer are patterned and etched substantially concurrent with the trench T formation process. These active areas are frequently the location of transistors or other components of integrated circuits.

A thermal oxide 2A can be grown or deposited in the trench T, thereby lining the trench T and providing greater resistance to cracking, and for passivating the trench sidewalls. The trench T is then filled with a material 4 which functions as an insulator, thereby providing isolation of the various electrical devices which may be disposed on the substrate 1. The isolation material 4 is frequently a thick layer of oxide, such as (tetraethyl orthosilicate) TEOS, CVD-oxide, BPSG, nitride, or a combination thereof, or a similar insulating material, which is preferably deposited. Other materials have also been found to be effective for use in isolation trenches T, such as, for example, a combination of nitride and oxide, or polysilicon which has been oxidized.

The isolation material 4 fills the trench T and covers the surface of the substrate 1 having layers 2 and 3 disposed thereon.

FIG. 5 illustrates the present invention after a planarization step has been performed. The planarization can be accomplished by any suitable method, such as chemical-mechanical polishing (CMP), or a dry etch, or a combination thereof When the overfill of the isolation material 4 is planarized, a portion of the isolation material 4 remains which extends beyond the surface of the substrate 1.

The structure of FIG. 6 results after layer 3 is removed, preferably via a wet etch. However, other suitable methods can also be used. The portion of the isolation material 4 which protrudes above the substrate 1 surface becomes more evident at this stage. The protruding portion of the isolation material 4 has substantially vertical sides.

If a pad oxide etch is performed at this point, the uneven profile, characterized by recessed isolating material 4', of the structure in FIG. 1 often results. The structure of FIG. 1 is prone to reliability defects and defective endproducts due to the inverse narrow width effect. Consequently, leakage along the isolation trench T' at the corners results.

However, in the process of the present invention, another insulating material 5 is deposited. The insulating material 5 is, preferably a material having similar chemical properties to isolating material 4. Therefore, material 5 is likewise an oxide, such as, TEOS or nitride with TEOS or (borophosphosilicate glass) BPSG. The preferred embodiment employs CVD-oxide.

Other suitable deposited dielectrics can be used, as well as polysilicon which is subsequently oxidized. Borophosphosilicate glass (BPSG) is another possibility for use as the insulating material 5. The insulating material 5 usually conforms to the profile of the structure, as shown in FIG. 7. The conformal properties of the insulating material 5 enable the self-alignment of the spacers 5.

Figure 8:
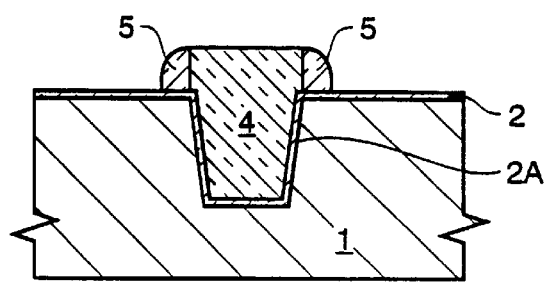
FIG. 8 is a schematic cross-section of the substrate of FIG. 7, illustrating remnants of the insulating layer which protect the edges of the trench, according to the present invention.

The structure of FIG. 8 results after a partial spacer etch is performed. The partial spacer etch is preferred because such a dry etch tends not to damage the active area regions which may also be disposed on the silicon 1. The spacers 5 formed from the conformal layer 5 have similar chemical properties to the isolation material 4. In the preferred embodiment, the conformal material 5 is the same as the isolating material 4. The spacers 5 are located on the surface of the substrate 1 at the corners of the trench T, and are self-aligned to the trenches T.

Figure 9:
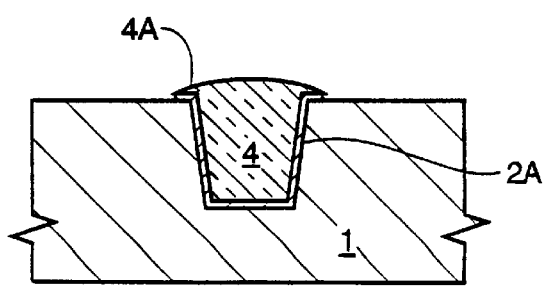
FIG. 9 is a schematic cross-section of the substrate of FIG. 8, after the remnants of the insulating layer have been partially combined with the isolating material, according to the present invention.

Preferably, a wet pad oxide etch is then performed which results in the structure of FIG. 9. The isolating material 4 combines with the spacers 5 to form an isolation trench T having a dome or cap-like covering 4a, and a smooth profile. The dome 4a extends over the peripheral edges of the trench T, thereby substantially overcoming the "corners" effect, and consequent leakage between active areas on the substrate 1.

In FIG. 2 a gate oxide layer 2B and a gate layer 6 have been grown. The gate oxide 2B can also be deposited. At this stage, gates or other microminiature structures can be fabricated on the substrate 1.

Attention is called to U.S. Pat. No. 4,729,006, entitled "Sidewall Spacers for CMOS Circuit Stress Relief/Isolation and Method for Making," to Daily, et al. for further details of the trench fabrication process.

All of the U.S. Patents cited herein are hereby incorporated by reference herein as if set forth in their entirety.

While the particular process as herein shown and disclosed in detail is fully capable of obtaining the objects and advantages herein before stated, it is to be understood that it is merely illustrative of the presently preferred embodiments of the invention and that no limitations are intended to the details of construction or design herein shown other than as described in the appended claims. For example, one having ordinary skill in the art will realize that the trench of the present invention and the process of making the same can be used to isolate a variety of active microminiature structures, such as, for example field emitters.

What is claimed is:

1. A process of forming an isolation structure on a semiconductor substrate, comprising steps of:

providing a semiconductor substrate;

forming at least one trench in said semiconductor substrate, said trench having a peripheral edge;

disposing an electrically insulating material in said trench, said material extending over said peripheral edge of said trench and covering at least a portion of said substrate beyond said trench; and etching said electrically insulating material including at least a portion thereof extending over said peripheral edge to form said isolation structure with a dome-shaped cap over said trench.

2. The process according to claim 1, further comprising a step of lining said trench and said substrate with a conformal layer, said conformal layer being disposed conformably intermediate said substrate and said electrically insulating material.

3. The process according to claim 2, further comprising a step of depositing a second layer over said substrate, said second layer covering regions of said substrate outside said trench and leaving an opening over said trench for use during said step of disposing said electrically insulating material in said trench.

4. The process according to claim 3, wherein said disposing of said electrically insulating material in said trench comprises steps of:

depositing said electrically insulating material conformably over said substrate masked by said patterned second layer;

planarizing said electrically insulating material to expose said second layer; and removing said second layer.

5. A process of forming an isolation structure for a semiconductor substrate comprising steps of:

providing a semiconductor substrate within which to form said isolation structure;

forming a groove in said semiconductor substrate;

conformally layering said substrate with a first layer, said first layer lining said groove;

providing a second layer over said substrate, said second layer patterned with an opening over said groove;

disposing electrically insulating material over said substrate masked by said second layer;

planarizing said electrically insulating material to expose said second layer;

after said step of planarizing, removing said second layer and leaving a portion of said electrically insulating material protruding beyond a surface plane of said substrate;

conformally layering a third layer over said substrate and said protruding portion of said electrically insulating material;

selectively removing portions of said third layer to define spacers adjacent sidewalls of said protruding portion of said electrically insulating material, said spacers including a portion extending over said substrate outside a peripheral edge of said groove; and etching said electrically insulating material and said spacers to from said isolation structure with a rounded cap over said groove.

6. The process according to claim 5, wherein said third layer comprises an electrically insulating material.

7. The process according to claim 6, further comprising the step of depositing another conformal layer over said substrate, said spacers and said protruding portion of said electrically insulating material.

8. A process of forming an isolation region for a semiconductor substrate comprising steps of:

forming a groove in a semiconductor substrate;

providing a mask layer over said substrate, said mask layer having an opening over said groove;

disposing electrically insulating material conformably over said substrate masked by said mask layer;

removing said mask layer while leaving a portion of said electrically insulating material in said groove and protruding away from, beyond a surface plane of, said substrate;

forming spacers adjacent sidewalls of said protruding portion of said electrically insulating material; and etching said electrically insulating material and said spacers to provide said electrically insulating material and said spacers with a dome-shaped cap over said groove.

9. A process according to claim 8, further comprising a step of lining said groove with a conformal layer intermediate material of said substrate and said electrically insulating material.

10. A process according to claim 8, further comprising a step of planarizing said electrically insulating material to expose material of said mask layer before said step of removing the mask layer.

11. A process according to claim 8, wherein said electrically insulating Material comprises at least one of oxide, TEOS, BPSG, and nitride.

12. A process according to claim 11, wherein said spacers comprise an electrically insulating material.

* * * * *